(12) United States Patent
Sommer

(10) Patent No.: US 6,849,893 B2
(45) Date of Patent: Feb. 1, 2005

(54) SEMICONDUCTOR CIRCUIT STRUCTURE AND METHOD FOR FABRICATING THE SEMICONDUCTOR CIRCUIT STRUCTURE

(75) Inventor: Michael Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/626,957

(22) Filed: Jul. 25, 2003

(65) Prior Publication Data

US 2004/0016988 A1 Jan. 29, 2004

(30) Foreign Application Priority Data

Jul. 25, 2002 (DE) .......................................... 102 33 760

(51) Int. Cl.⁷ ...................... H01L 27/108; H01L 29/76; H01L 29/94; H01L 31/119
(52) U.S. Cl. ...................... 257/302; 257/301; 257/328; 257/329; 257/330; 257/331; 257/332; 257/333; 257/334; 257/908
(58) Field of Search ................................ 257/301–302, 257/328–334, 908

(56) References Cited

U.S. PATENT DOCUMENTS

| | | | | |
|---|---|---|---|---|
| 4,961,100 A | * | 10/1990 | Baliga et al. | 257/172 |
| 5,053,839 A | * | 10/1991 | Esquivel et al. | 257/317 |
| 5,225,697 A | * | 7/1993 | Malhi et al. | 257/302 |
| 5,378,907 A | | 1/1995 | Melzner | |
| 5,512,517 A | * | 4/1996 | Bryant | 438/302 |
| 5,744,386 A | * | 4/1998 | Kenney | 438/245 |
| 5,885,878 A | * | 3/1999 | Fujishima et al. | 438/302 |
| 6,060,739 A | * | 5/2000 | Saitoh | 257/314 |
| 6,252,277 B1 | * | 6/2001 | Chan et al. | 257/330 |
| 6,498,108 B2 | * | 12/2002 | Cao et al. | 438/706 |
| 6,756,622 B2 | * | 6/2004 | Noble | 257/296 |
| 2002/0140028 A1 | * | 10/2002 | Blanchard | 257/335 |

FOREIGN PATENT DOCUMENTS

| | | |
|---|---|---|
| DE | 39 14 055 A1 | 10/1990 |
| DE | 41 03 105 A1 | 8/1991 |
| DE | 41 25 199 A1 | 2/1993 |
| DE | 100 16 444 A1 | 10/2001 |

* cited by examiner

*Primary Examiner*—Amir Zarabian
*Assistant Examiner*—Ida M. Soward
(74) *Attorney, Agent, or Firm*—Laurence A. Greenberg; Werner H. Stemer; Gregory L. Mayback

(57) ABSTRACT

A circuit structure has at least two etching trenches disposed at sidewalls of a silicon block left behind during the etching of the structure. The etching trenches are disposed at angles with respect to one another that are prescribed by the form of the silicon block left behind. Semiconductor layer structures which can interact with one another diagonally across are in each case accommodated in the etching trenches. In this case, the function of the entire circuit structure results from the interaction of the layer structures disposed in the various etching trenches.

23 Claims, 13 Drawing Sheets

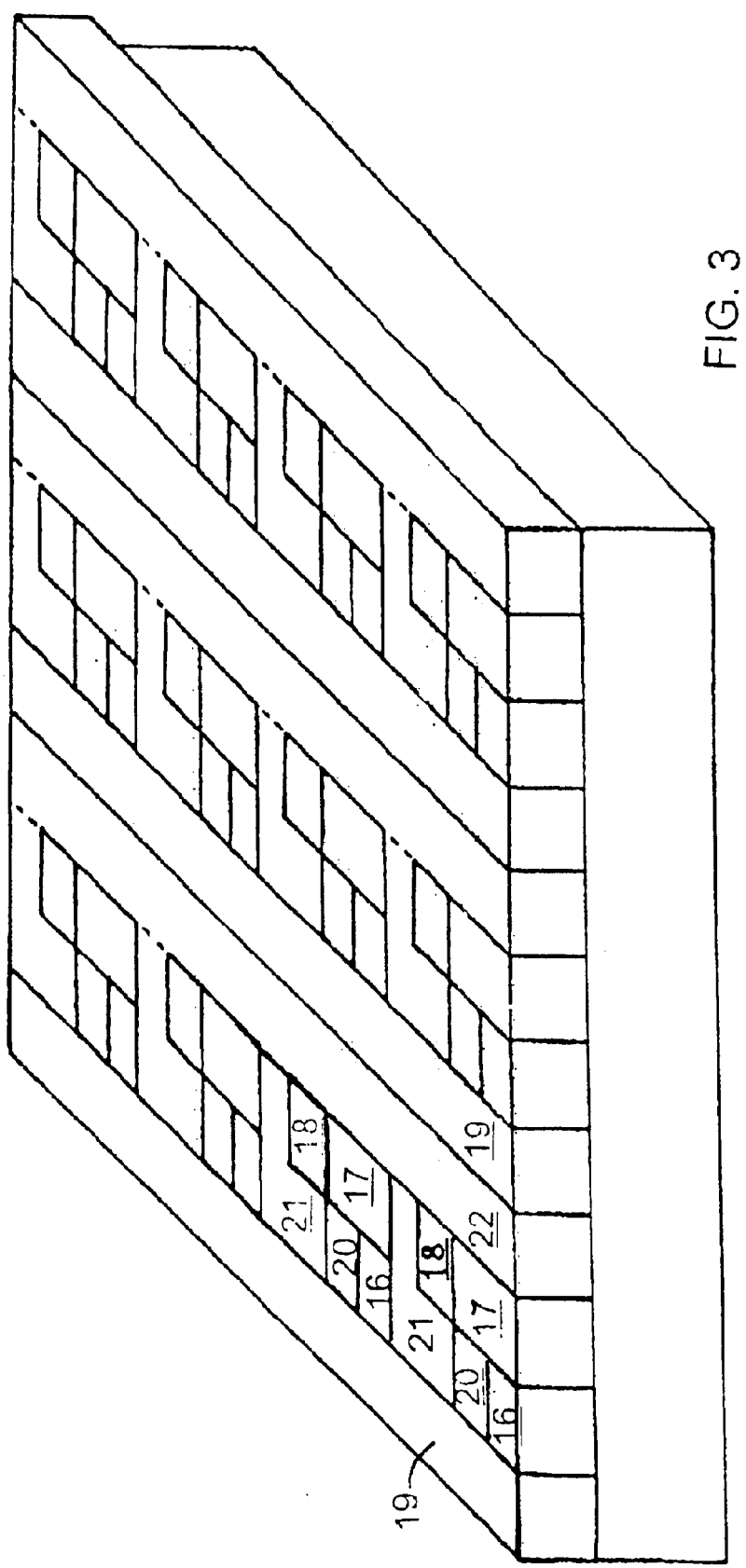

SEMICONDUCTOR CIRCUIT STRUCTURE AND METHOD FOR FABRICATING THE SEMICONDUCTOR CIRCUIT STRUCTURE

BACKGROUND OF THE INVENTION

Field of the Invention

The invention relates to a circuit structure for a silicon substrate and to an array configuration having a multiplicity of circuit structures disposed on the silicon substrate. Furthermore, the invention relates to a method for fabricating such an array configuration.

The best known example of a regular configuration of identical semiconductor structures on a silicon substrate is an array configuration of memory cells. The aim when fabricating such memory cell arrays is to accommodate as many memory cells as possible on the smallest possible silicon area in order, in this way, to be able to realize memory chips having a high storage capacity. The best known types of memory cells are dynamic random access memories (DRAMs) and static random access memories (SRAMs).

In a DRAM memory cell, the digital information is stored as charge in a storage capacitor. The storage capacitor can be realized in a space-saving manner with the aid of a trench etched into the silicon substrate. A trench filling serves as an inner capacitor electrode, and the surrounding silicon substrate serves as an outer electrode of the storage capacitor. Since the lateral extent of the trench is small, the base area required per memory cell is small. One disadvantage of DRAM memory cell arrays is that the digital information stored in the storage capacitors has to be refreshed at periodic intervals. The reason for this is that the storage capacitors are discharged on account of leakage currents and the stored information is lost over the course of time. In order to prevent this, the digital information is read at periodic intervals and subsequently rewritten to the memory cells again. However, carrying out the refresh is associated with a considerable electrical power consumption.

In contrast to this, the electrical power required when using SRAM memory cells is very low. In an SRAM memory cell, the digital information is stored with the aid of a bistable multivibrator. Such a bistable multivibrator has two stable circuit states. If the circuit is in the first circuit state, then a digital value "0" is stored in the SRAM cell. The second stable circuit state of the multivibrator represents the digital value "1". Owing to the two possible circuit states, bistable multivibrators are also referred to as "flip-flops".

In order to realize an SRAM memory cell, a selection transistor is additionally required besides the flip-flop circuit. The flip-flop is written to or read from by the source-drain path of the selection transistor. In total, five or even six field-effect transistors are necessary for realizing an SRAM memory cell, the transistors being fabricated in a manner disposed one beside the other in the case of a conventional chip layout. This results in a significantly higher space requirement for an individual SRAM memory cell in comparison with the DRAM cell. The advantage of low power consumption is thus opposed by the disadvantage of an increased space requirement.

SUMMARY OF THE INVENTION

It is accordingly an object of the invention to provide a semiconductor circuit structure and a method for fabricating the semiconductor circuit structure that overcome the above-mentioned disadvantages of the prior art devices and methods of this general type, in which the silicon area required for a circuit structure of the array is further reduced.

With the foregoing and other objects in view there is provided, in accordance with the invention, a circuit structure. The circuit structure includes a silicon substrate having at least two etching trenches defining a silicon block having sidewalls. The etching trenches are etched out in a manner adjoining the sidewalls of the silicon block. The etching trenches are disposed at angles with respect to one another prescribed by a form of the silicon block. Layer structures are disposed in the etching trenches. A function of the circuit structure results from an interaction of the layer structures disposed in the etching trenches.

The circuit structure according to the invention has the silicon block left behind after the etching of the structure, and also at least two etching trenches, which are in each case assigned to a sidewall of the silicon block, and which are etched out of the silicon substrate in a manner adjoining the sidewall of the silicon block. In this case, the etching trenches are disposed at angles with respect to one another that are prescribed by the form of the silicon block left behind. Semiconductor layer structures are in each case disposed in the etching trenches, the function of the entire circuit structure resulting from the interaction of the semiconductor layer structures disposed in the various etching trenches.

Instead of being disposed one beside the other as in the case of conventional chip layouts, the semiconductor structures are disposed into the depth in the case of the solution according to the invention. For this purpose, trenches are etched all around a silicon block and are then filled with corresponding semiconductor layer structures. Within the etching trenches, insulating regions produced by the deposition of insulation material alternate with conductive regions, in particular interconnects. Field-effect transistors can also be patterned within the trenches, here the doped source and drain regions are introduced into the silicon block from the etching trench, so that the actual channel region is formed within the silicon block.

In this respect, the sidewalls of the silicon block fulfill the function that is fulfilled by the silicon substrate in the case of a conventional planar chip layout. Whereas first a gate contactor (GC) plane, then a via plane, then a first metallization plane with interconnects, etc. are disposed above the silicon substrate in the case of a planar layer construction, these various functional planes are swung into the vertical in the case of the approach of the invention. The trenches disposed around the silicon block can thus be visualized as metallization planes or via planes tilted through 90°. This affords the advantage over conventional chip layouts of a hugely reduced space requirement for the respective semiconductor structure. With the use of the circuit structure according to the invention, an SRAM memory cell, which has hitherto taken up a multiple of the base area of a DRAM cell, can be constructed on the same base area as a DRAM memory cell.

Different layer structures can be introduced into the various etching trenches grouped around the silicon block. For this purpose, the individual etching trenches are successively etched by separate etching masks and then immediately filled with different protective materials. A specific etching trench can then be uncovered by selective removal of a specific protective material. The layers required for forming a specific layer structure can thereupon be deposited in the uncovered etching trench.

Since the individual etching trenches are disposed at the different sides of a silicon block, adjacent etching trenches form an angle with respect to one another that is prescribed by the geometry of the silicon block. Since the individual etching trenches are disposed diagonally across from one another, it is possible to establish electrical connections between adjacent etching trenches. With this possibility of producing electrical connections between different layer structures, more complex circuit configurations can also be realized with the circuit structure according to the invention. If a parallelepipedal block is provided as the silicon block, then the circuit can be divided between four different etching trenches that are connected to one another. For even more complicated structures, silicon blocks with a hexagonal or octagonal base area may also be provided, so that the corresponding circuit configuration can be distributed between six, eight or even more etching trenches.

It is advantageous if conductive structures, preferably composed of polysilicon, are disposed within the etching trenches. For the purpose of patterning conductive tracks within the etching trenches, a layer of conductive material is deposited into the corresponding etching trench. Highly doped polysilicon, in particular, is suitable as a material for such conductive structures.

In accordance with an advantageous embodiment of the invention, field-effect transistors are formed within the etching trenches. In this case, a field-effect transistor contains a first diffusion region as a first source/drain region, the first diffusion region extending into the silicon block, a conductive gate region and also a second diffusion region as a second source/drain region, the second diffusion region extending into the silicon block. A conductive channel can be formed between the first and the second source/drain regions depending on the potential of the gate region.

In order to fabricate a field-effect transistor in one of the etching trenches, first a heavily doped polysilicon layer is deposited into the etching trench. The doping atoms are subsequently caused to indiffuse into the silicon block by a heat treatment step. In this way, a diffusion region is produced which extends from the highly doped layer disposed in the trench into the silicon block. The diffusion region represents the first source or drain region of the field-effect transistor. After the outdiffusion, the highly doped layer in the etching trench can be removed again. In order to produce the gate region of the field-effect transistor, first a gate oxide is applied to the sidewall of the silicon block. The gate oxide layer insulates the channel region of the field-effect transistor from a gate electrode. After the growth of the gate oxide, conductive material is deposited into the etching trench, the conductive material serving as the gate region. Next, it is necessary to fabricate the second source/drain region. For this purpose, once again highly doped polysilicon is deposited into the etching trench and subsequently indiffused into the silicon block by heating. This produces an indiffused strip of high doping concentration that extends within the silicon block horizontally over the entire sidewall of the silicon block. As a result, a structure is produced in which a channel region is disposed between the first and the second strip-type source/drain region. A conductive channel forms between the strip-type source/drain regions depending on the potential of the gate region. The field-effect transistor thus produced is very wide and therefore has a high current yield.

Owing to the simple construction—containing three layers—of such a field-effect transistor, it is possible to accommodate a plurality of field-effect transistors one above the other within an etching trench.

It is advantageous if regions having different doping concentrations and/or a different conductivity type are disposed within the silicon block. The ion implantation makes it possible to produce n-doped or p-doped implantation regions of a predetermined doping concentration at a specific depth from the surface of the silicon block. By way of example, it is possible to produce, within the silicon block, an upper p-doped region and also an n-doped region disposed deeper. Different doping regions having a different conductivity type can be produced within one and the same silicon block. This is of importance particularly when both n-type field-effect transistors (n-FETs) and p-type field-effect transistors (p-FETs) are required for the realization of a circuit configuration, as is the case for example with SRAM memory cells. An n-FET has to be formed within a weakly p-doped substrate region while conversely a p-FET has to be disposed in a weakly n-doped substrate region. Differently doped substrate regions can be produced within one and the same silicon block with the aid of the ion implantation.

It is advantageous if conductive structures within a first etching trench and conductive structures within an adjacent second etching trench are electrically connected to one another by doped diffusion regions which extend from the first and second etching trenches into the silicon block left behind and have an overlap region. This technique of overlapping diffusion regions affords a possibility of electrically connecting a diffusion region produced from a first etching trench to a diffusion region which is produced from a second etching trench and is disposed at the same depth. As a result, it is possible to produce electrical connections between the different layer structures in the various etching trenches. If the overlap region and also the doping concentrations in the diffusion regions are chosen to be large enough, then a readily conductive connection is produced between the diffusion regions involved.

In this case, it is advantageous if the voltage supply and signal lines for the semiconductor structures are in each case accommodated in one of the etching trenches. Respective electrical connections to the adjacent etching trenches can then be produced in order to supply the structures accommodated in the etching trenches with voltage, and in order to make specific signals available. This leads to a clearer chip layout; the configuration of the circuit is simplified.

Furthermore, it is advantageous if the voltage supply lines and signal lines are in each case accommodated in one of the etching trenches, if the semiconductor structures are accommodated in a further etching trench, and if the interconnections of the semiconductor structures are accommodated in the further etching trench. This embodiment has parallels with a conventional planar construction in which metallization planes and via planes alternate with one another. In this case, the etching trench in which the semiconductor structures are accommodated corresponds to a metallization plane, while the etching trench in which the interconnections are accommodated corresponds more to a via plane. This results in a chip layout in which the semiconductor structures are accommodated in one etching trench, while they can be interconnected as desired from the other etching trenches.

In accordance with an advantageous embodiment of the invention, the silicon block is a silicon parallelepiped. In this case, it is advantageous, in particular, if four etching trenches are disposed around the silicon parallelepiped. This embodiment of the invention results in a chess board-like chip layout. Such a regular configuration of the etching trenches affords production engineering advantages. What is more, four etching trenches disposed around the silicon block usually suffice to accommodate even more complex circuit structures.

In accordance with an advantageous embodiment of the invention, the circuit structure is an SRAM memory cell. SRAM memory cells are constructed from a plurality of field-effect transistors, so that a conventional planar construction results in a considerable space requirement per SRAM memory cell. In this respect, it makes sense, precisely in the case of SRAM memory cells, to dispose the corresponding structures according to the solution according to the invention in etching trenches, so that they take up less space as buried structures. The space required per SRAM memory cell on the silicon substrate can be greatly reduced as a result. With the use of the solution according to the invention, a space requirement that approximately corresponds to the space requirement of a DRAM memory cell results per SRAM memory cell.

It is advantageous if the SRAM memory cell contains a plurality of field-effect transistors interconnected to form a flip-flop and also a selection transistor. The five or six field-effect transistors required per SRAM memory cell can be accommodated without difficulty in the etching trenches disposed around the silicon block.

In this case, it is advantageous if the field-effect transistors interconnected to form a flip-flop contain both n-FETs and p-FETs, the n-FETs being disposed in the region of a p-doped region of the silicon block, and the p-FETs being disposed in the region of an n-doped region of the silicon block. A flip-flop of the type described in this application contains both n-FETs and p-FETs. While n-FETs have to be disposed within a p-doped substrate, an n-doped substrate is necessary for p-PETs. However, the two types of FETs can nevertheless be disposed within a common silicon block if this silicon block has a plurality of substrate regions of a different doping type. By way of example, an upper, p-doped region and an n-doped region located at a deeper level could be produced from the surface of the silicon block by ion implantation. The n-FETs can then be disposed within the upper, p-doped region, while the p-FETs are accommodated in the n-doped region.

It is advantageous if the flip-flop can be connected to a bit line disposed at the surface of the silicon substrate by the source-drain path of the selection transistor. If the source-drain path conducts, then the flip-flop is connected to the associated bit line by the selection transistor. The flip-flop can then be read from or written to by the bit line. The bit lines assigned to the various SRAM memory cells are disposed parallel to one another at the surface of the silicon substrate and take up no additional space.

It is advantageous if the selection transistor can be activated by a word line disposed in one of the etching trenches. The flip-flop is selected by the word line and can then be written to and read from by the associated bit line. The source-drain path of the selection transistor is activated or blocked according to the potential present on the word line. If the word lines are disposed within the etching trenches, then no additional space requirement results for the word lines.

In accordance with an advantageous embodiment of the invention, the word line serves as a gate region of the selection transistor, a gate oxide layer being disposed between the word line and the silicon block. Depending on the potential of the word line, a conductive channel can then form below the gate oxide layer, and the source-drain path of the selection transistor is changed over to the conductive state. If the word line is disposed in one of the etching trenches in such a way that it runs adjacent to the active region between the source electrode and the drain electrode, then the word line itself can serve as gate region of the selection transistor, and the geometry of the circuit configuration is simplified further. If the word line is disposed in such a way that it can serve directly as gate region of the selection transistor, then an additional space saving results from this.

It is advantageous if the upper region of the silicon block is formed as a doped region with which the bit line disposed at the surface of the silicon substrate is contact-connected. A reliable bit line contact connection can be realized with the aid of a highly doped region at the upper end of the silicon block. The doped region at the upper end of the silicon block can be produced in a simple manner by ion implantation from the surface of the silicon block.

In this case, it is advantageous if the upper region of the silicon block is formed as a doped region which serves as source or drain electrode of the selection transistor. The highly doped region at the upper end of the silicon block fulfills a dual function in this respect: first, the region serves for the contact connection of the bit line running above it; second, the selection transistor can be disposed in such a way that the doped upper region of the silicon block simultaneously serves as the upper source/drain electrode of the selection transistor. For this purpose, the selection transistor is disposed in one of the etching trenches in such a way that the gate region of the selection transistor is situated somewhat below the doped upper region of the silicon block. As a result, a channel region can be formed below the doped upper region of the silicon block and a connection to the flip-flop of the SRAM memory cell can then be produced by the channel region. A particularly space-saving configuration of the various functional elements is achieved in this way, which configuration, moreover, can be fabricated in a simple manner.

The array configuration according to the invention contains a multiplicity of circuit structures of the type described above disposed on a silicon substrate. During the production of such an array, all the etching trenches disposed at a specific side of the silicon blocks can be etched simultaneously in a single method step. The construction of the layer structures can also be carried out simultaneously for all the etching trenches assigned to a specific side of the silicon blocks. In terms of the production engineering outlay, therefore, it makes no difference whether an individual circuit structure or an entire array of repeatedly disposed circuit structures is produced. For this reason, the invention is suitable in particular for the fabrication of arrays in which a specific basic circuit is disposed repeatedly and in a regular configuration on a silicon substrate. Memory cells, in particular, and especially SRAM memory cells, are disposed in such arrays and are therefore suitable for the solution according to the invention.

In accordance with an advantageous embodiment of the invention, the etching trenches disposed in each case in a manner adjoining a specific sidewall of the silicon blocks are lengthened to form continuous etching trenches extending across a plurality of silicon blocks, voltage supply lines and signal lines being accommodated in the continuous etching trenches. In this embodiment of the array configuration according to the invention, long etching trenches are provided which run along a multiplicity of circuit structures according to the invention and supply them with voltage, inter alia. Accommodated within the long etching trenches is a layer structure which, in addition to the voltage supply lines, also contains other signal lines in order thus to enable the exchange of signals between the various circuit structures. With the aid of continuous etching trenches, an entire group of circuit structures can in each case be supplied with voltage. A central voltage supply of the array is made possible in this way. This is significantly simpler and saves more space than if each circuit structure had to be supplied individually with voltage.

In the method according to the invention for fabricating an array configuration having a multiplicity of circuit structures disposed on a silicon substrate, first etching trenches are etched in each case in a manner adjoining first sidewalls of silicon blocks. In this case, the silicon blocks are not etched and remain behind. Afterward, the first etching trenches are filled with a first protective insulation. In a next step, further etching trenches are etched in each case in a manner adjoining further sidewalls of the silicon blocks. The further etching trenches are thereupon filled with a second protective insulation. The last two steps are repeated until all the required etching trenches have been produced. During the fabrication method, all the etching trenches disposed at a specific side of the silicon blocks can be patterned using a first etching mask. The trenches are then sealed with a protective insulation. Further etching trenches are subsequently patterned and are then likewise filled with a protective insulation. The fabrication of the layer structures within the individual etching trenches is begun only when all the etching trenches have been produced. This has the advantage that aggressive etching processes no longer have to be taken into consideration during the patterning of the individual layers of a layer structure.

It is advantageous if the fabrication method includes a further step of selective etching-out of the respective protective insulation, and a subsequent step of production of the respective semiconductor layer structure in the respective etching trenches. In this way, it is possible to strip the protective insulations successively from the etching trenches and to introduce the corresponding layer structures into the etching trenches.

In accordance with a further advantageous embodiment of the method, diffusion regions are produced which extend into the silicon blocks left behind by a procedure in which first correspondingly n-doped or p-doped material is deposited into the respective etching trenches to the desired depth; afterward, the n-doped or p-doped material is indiffused into the silicon blocks in a heat treatment step. In this way, proceeding from a highly doped layer, it is possible to produce a correspondingly doped diffusion region within the silicon block which can serve for example as source or drain region of a field-effect transistor.

Other features which are considered as characteristic for the invention are set forth in the appended claims.

Although the invention is illustrated and described herein as embodied in a semiconductor circuit structure and a method for fabricating the semiconductor circuit structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a perspective view of an array configuration of etching trenches and silicon blocks left behind;

DESCRIPTION OF THE PREFERRED EMBODIMENTS

Figure 1:
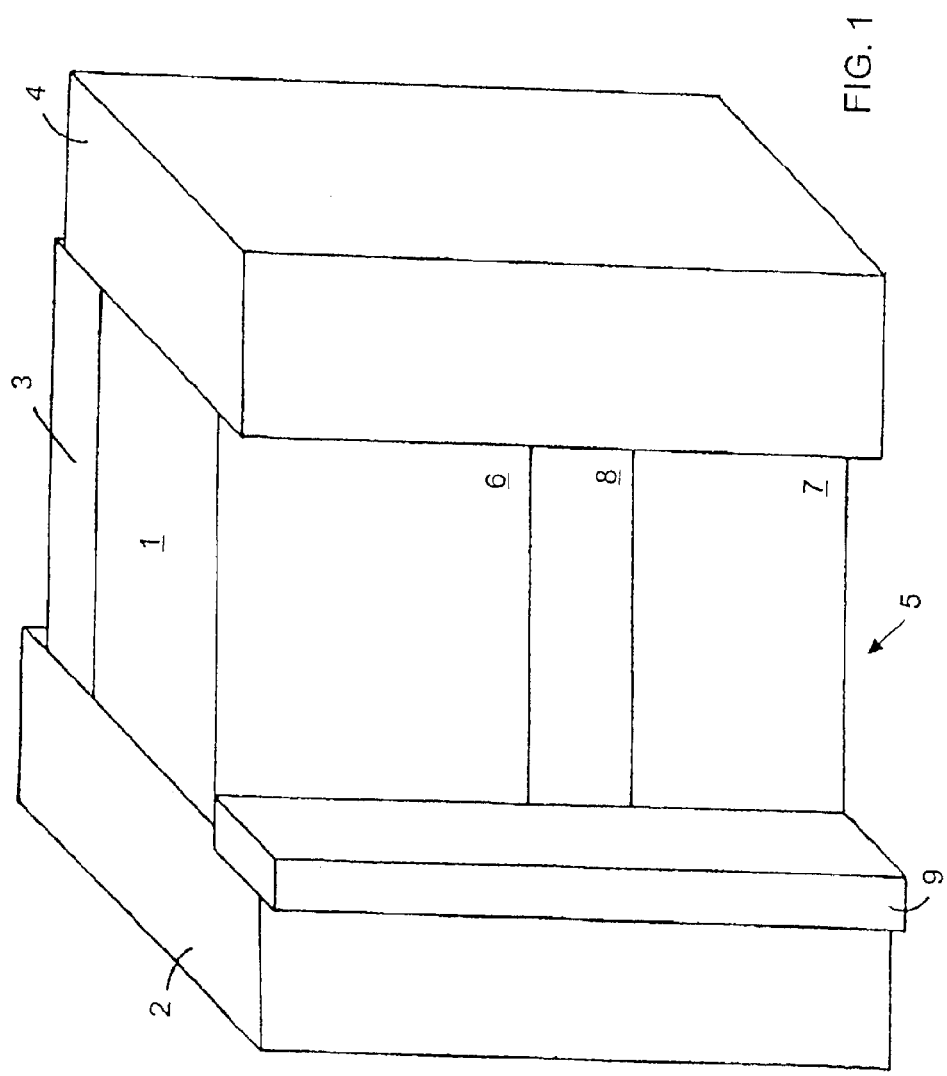
FIG. 1 is a perspective view of a silicon structure according to the invention, which reveals a configuration of etching trenches forming a silicon block left behind.

Referring now to the figures of the drawing in detail and first, particularly, to FIG. 1 thereof, there is shown the principle of a circuit structure according to the invention. Etching trenches 2, 3, 4, 5 are formed around a silicon block 1, which has been left behind during the etching process. The etching trenches 2–5 serve to receive semiconductor layer structures, it being possible for different layer structures to be accommodated in the various etching trenches 2, 3, 4, 5. The layer structures disposed at the different sides of the silicon block 1 can interact with one another diagonally across, the functionality of the entire circuit configuration resulting from the interaction of the layer structures accommodated in the etching trenches 2, 3, 4, 5.

In order to fabricate the etching trenches 2–5, a photoresist layer is applied to an etching mask, exposed by of a lithography method and then etched. In this case, areas essentially corresponding to the cross-sectional area of one of the etching trenches 2–5 are etched out of the photoresist. The silicon substrate is thereupon etched down to a predetermined depth in order to produce one of the etching trenches 2, 3, 4, 5 in this way. After the etching of a specific etching trench, for example of the etching trench 3, the etching trench is filled with a protective insulation. In this way, etching trenches that have already been produced can no longer be altered by subsequent etching steps. In this way, the various etching trenches 2, 3, 4, 5 can be successively patterned by photomasks provided therefore and subsequently sealed. It is only after all the etching processes have been concluded that it is then possible to selectively remove the protective insulation material in a specific etching trench in order subsequently to produce the semiconductor layer structure in the etching trench.

The silicon block 1 serves as the silicon substrate for the semiconductor structures accommodated in the etching trenches 2–5. The circuit structure according to the invention can therefore be visualized such that a planar semiconductor structure is tilted into the vertical. In order that both n-type and p-type field-effect transistors can be patterned into the silicon block 1 from a respective etching trench, the silicon block 1 has an upper, p-doped region 6 and also a lower, n-doped region 7, which are separated from one another by an intrinsic transition region 8. The differently doped regions can be produced by ion implantation. To that end, ionized doping atoms are fired into the silicon substrate from the surface of the silicon substrate. Typically, pentavalent doping atoms such as e.g. arsenic are used for producing an n-doped region, while a p-doped region can be produced with the aid of trivalent doping atoms such as e.g. boron. The depth to which the respective doping region is to be situated is defined in this case by the energy of the fired ions. The n-type FETs are subsequently accommodated in the upper, p-doped region 6, while the lower, n-doped region 7 is provided for receiving p-FETs.

FIG. 1 furthermore depicts an insulation region 9. The insulation region serves for the electrical isolation of interconnects disposed in the etching trenches 2 and 5. The insulation region 9 can be produced by growing insulation material from the etching trench 5 onto the protective insulation material situated in the etching trench 2.

Figure 2:
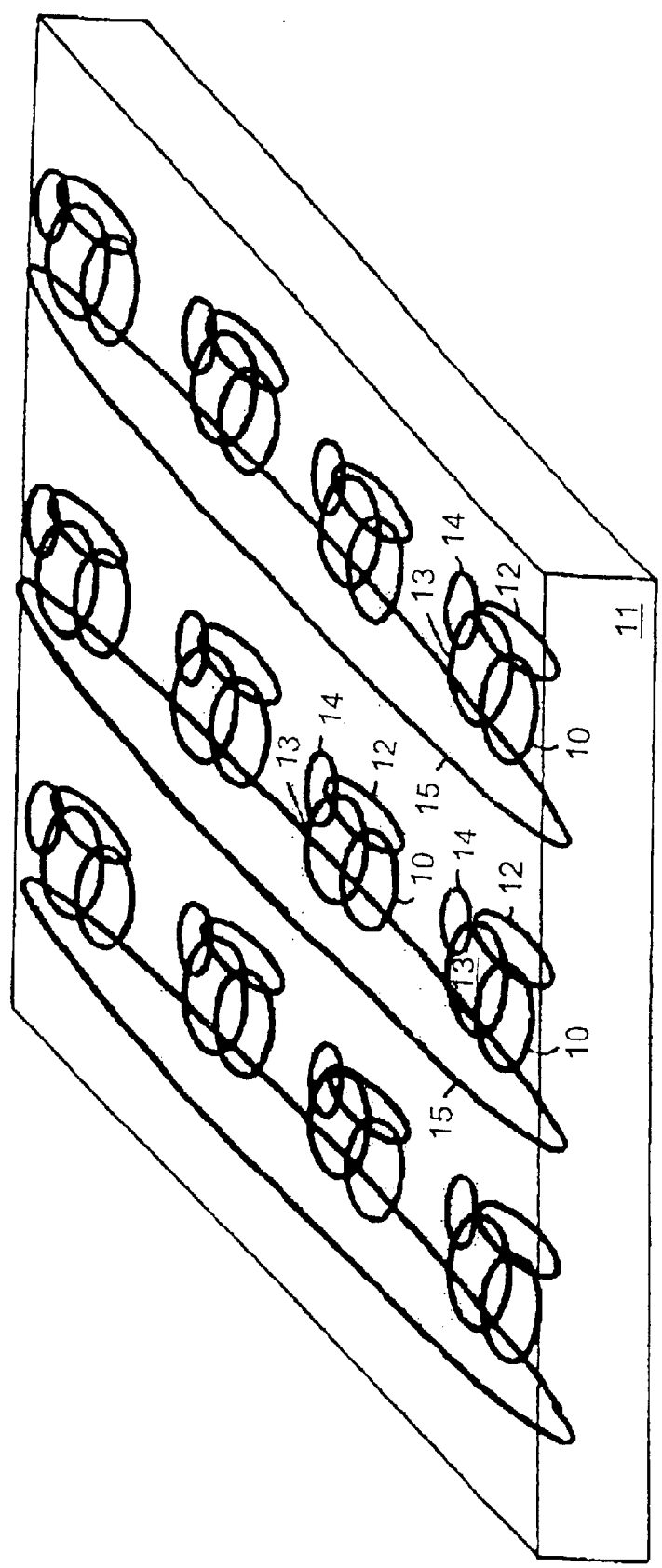
FIG. 2 is a perspective view of various photomasks required for producing the silicon structure.

FIG. 2 illustrates the various photomasks required for producing the circuit structure according to the invention. With the aid of a photomask 10, the etching trenches for receiving the front layer structure ("front bridge") can be etched out of a silicon substrate 11. Correspondingly, with the aid of a photomask 12, etching trenches for receiving the horizontal connections ("horizontal wiring") can be etched out of the substrate 11. Circles 13 circumscribe the region of the silicon blocks left behind during the etching process. Disposed in each case at the rear side of the silicon blocks is a further etching trench which serves for receiving the back layer structure ("back bridge"). A photomask 14 serves for producing the rear etching trenches.

It can be seen from FIG. 2 that the etching trenches respectively disposed at the left-hand side of the silicon blocks left behind are connected to form lengthened etching trenches which extend along a plurality of silicon blocks. These lengthened etching trenches are produced with the aid of a photmask 15. The voltage supply and signal lines with which the semiconductor layer structures situated in the rest of the etching trenches are supplied with voltage are subsequently accommodated within the lengthened etching trenches. Furthermore, signals which are intended to be available for all the circuit structures of the array can be distributed to the various circuit structures with the aid of the lengthened etching trenches.

FIG. 3 diagrammatically illustrates the spatial configuration of the etching trenches after the etching operation. Etching trenches 16, 17, 18, 19 are in each case disposed around silicon blocks 20 left behind. The etching trenches 16 serve for receiving the front layer structure ("front bridge"), the horizontal connections are accommodated in the laterally disposed etching trenches 17 ("horizontal wiring"), and the back layer structure ("back bridge") is in each case accommodated in the etching trenches 18 disposed at the respective rear side of the silicon blocks. The long etching trenches 19 run along a sidewall of the silicon blocks 20. Voltage supply lines and also signal lines run in the etching trenches 19. In order to insulate the various semiconductor structures of the array from one another, etching regions 21, 22 are provided which are completely filled with insulating material after the etching process.

The principle of the invention will be described in more detail below using a circuit example. The intention is to fabricate an array of SRAM memory cells, an SRAM memory cell in each case being intended to be disposed around each silicon block 20. The principle of the invention, namely of disposing semiconductor structures that interact with one another around a silicon block 20, may, however, also be applied to other circuit configurations.

Figure 4B:
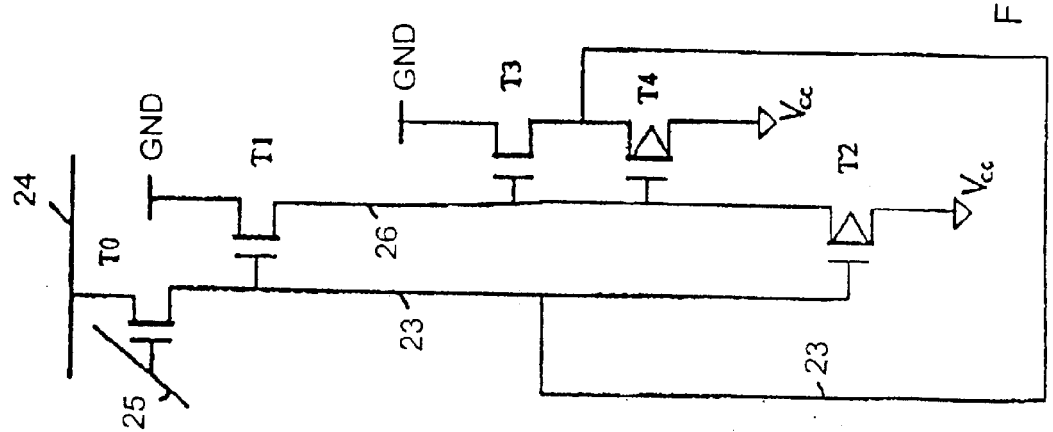
FIG. 4B is a circuit diagram of the circuit shown in FIG. 4A, in which the geometrical configuration of field-effect transistors is taken into account.
Figure 4A:
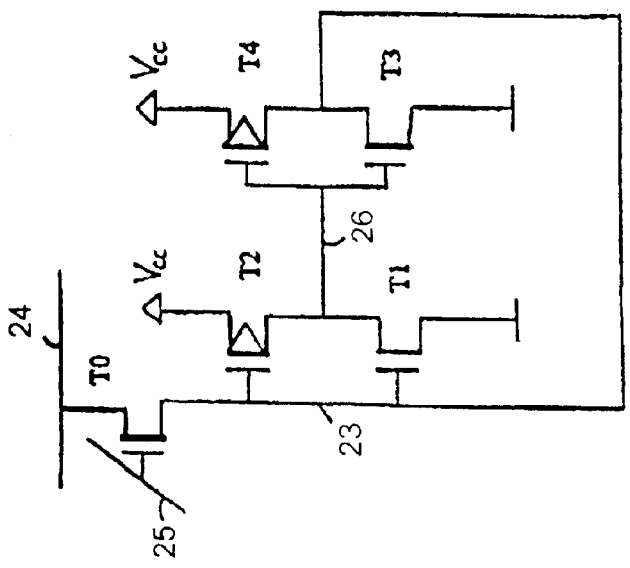
FIG. 4A is a circuit diagram of an SRAM memory cell.

FIG. 4A shows a circuit diagram of an SRAM memory cell. The SRAM memory cell contains a flip-flop constructed from two p-FETs T2, T4 and from two n-FETs T1, T3. Furthermore, the SRAM memory cell contains a selection transistor T0, which is realized as an n-FET in the circuit shown in FIG. 4A. A signal line 23 of the flip-flop can be connected to an associated bit line 24 by the source-drain path of the selection transistor T0, so that the flip-flop can be written to and read from by the bit line 24. For this purpose, the source-drain path of the selection transistor T0 can be activated depending on a potential of a word line 25. If the potential "1" is present, on the word line 25 (and thus also at a gate of the selection transistor T0), then the source-drain path of T0 is in the on state, and the memory cell can be read from or written to anew. By contrast, if the potential "0" is present at the gate of T0, then the n-FET T0 is in the off state.

The flip-flop contains the transistors T1, T2, T3 and T4 can assume two stable switching states. In this respect, one bit of information can be stored in the flip-flop. It will be assumed first that the potential "1" is present on the signal line 23. Therefore, the potential "1" is present at the gates of the n-FET T1 and of the p-FET T2, and T1 is in the on state, while T2 is in the off state. Therefore, by the source-drain path of T1, a signal line 26 is at the potential "0", that is to say at the opposite potential to the potential of the signal line 23. The potential "0" is present at the gates of the field-effect transistors T3, T4, and, therefore, the p-FET T4 is in the on state, while the n-FET T3 is in the off state. Therefore, by the source-drain path of T4, the signal line is at the potential "1", which corresponds to the assumption made at the beginning. The first stable switching state is thus characterized in that the potential "1" is present on the signal line 23 and the potential "0" is present on the signal line 26.

Exactly the opposite situation prevails in the case of the second possible switching state: here the signal line 23 is at the potential "0", T1 is in the off state, T2 is in the on state, the value "1" is present on the signal line 26, T3 is in the on state and T4 is in the off state.

In order to read from the SRAM memory cell, the signal line 23 is connected to a sense amplifier by T0 and the bit line 24. The sense amplifier typically amplifies the difference between the potential present on the signal line 23 and a reference potential, e.g. $V_{cc}/2$. When writing to the flip-flop by use of T0 the current flowing via the source-drain path of T0 must be large enough to be able to reverse the polarity of the entire flip-flop. Accordingly, the current yield chosen for the field-effect transistor T0 must be high.

Figure 5:
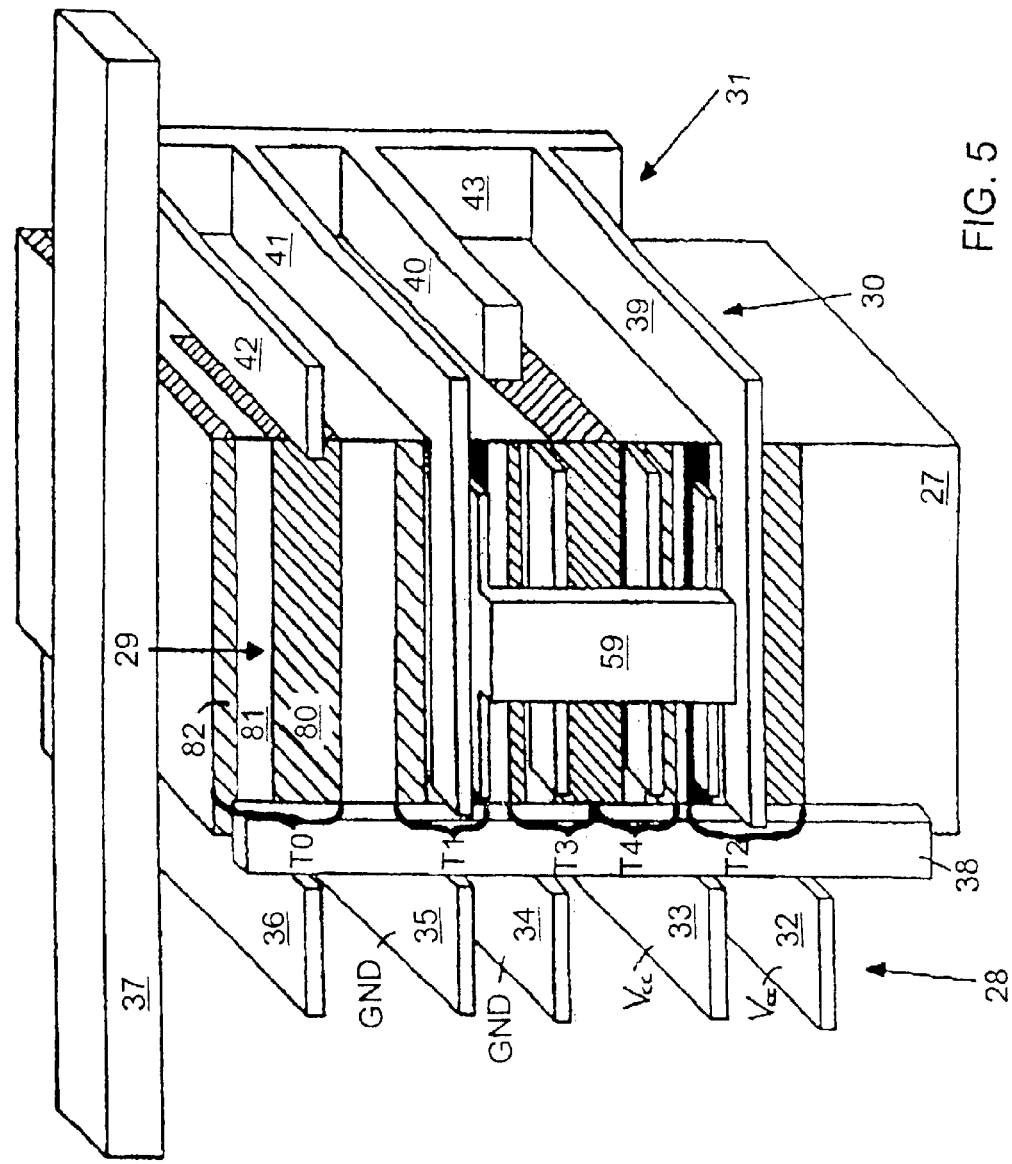
FIG. 5 is a perspective view of an SRAM cell patterned according to the principle of the invention.

The circuit diagram shown in FIG. 4A is depicted again in an altered configuration in FIG. 4B. Here, in contrast to FIG. 4A, the vertical configuration of the field-effect transistors T1 and T2 is interchanged. Equally, the vertical configuration of the field-effect transistors T3 and T4 is interchanged. The configuration of the transistors T0 to T4 shown in FIG. 4B corresponds to the configuration of the field-effect transistors in the semiconductor layer structure described below. The finished structure is illustrated in FIG. 5. A lengthened etching trench 28, a front etching trench 29, a lateral etching trench 30 and also a rear etching trench 31 are disposed around a silicon block 27. A front layer structure containing the field-effect transistors T2, T4, T3, T1 and also the selection transistor T0 is accommodated in the front etching trench 29. Voltage is supplied to the circuit configuration by voltage supply lines 32, 33, 34, 35 accommodated in the lengthened etching trench 28. The voltage supply lines 32 and 33 supply the potential $V_{cc}$ (or "1"). The drain electrodes of the transistors T2, T4 are connected to the potential $V_{cc}$ by the voltage supply lines 32, 33. The voltage supply lines 34, 35 disposed there-above are at the potential GND (or "0") and are connected to the source electrodes of the transistors T3, T1.

Furthermore, a word line 36, that simultaneously serves as a gate electrode of the selection transistor T0, is accommodated in the lengthened etching trench 28. By use of the source-drain path of T0, the flip-flop can be connected to a bit line 37 running at a surface of the silicon block 27. An insulation region 38 prevents undesirable electrical connections between the voltage supply and signal lines 32 to 36, on the other hand, and the semiconductor structures disposed in the front etching trench 29. Horizontal connections 39, 40, 41, 42 are accommodated in the lateral etching trench 30. Analogously to a planar layer construction, the horizontal connections 39–42 accommodated in the etching trench 30 could be identified with a via plane which produces connections between the front and back layer structures. The back layer structure, which merely contains a conductive plate 43 in the example illustrated, is situated in the rear etching trench 31.

The way in which the SRAM memory cell shown in FIG. 5 can be fabricated will be shown below with reference to FIGS. 6 to 13. For this purpose, the front layer structure accommodated in the etching trench 29 is to be fabricated first. The silicon block 27 forms the starting point in this case, the silicon block having a lower, n-doped region 44 produced by ion implantation, an intrinsic transition region 45 and an upper p-doped region 46 likewise fabricated by ion implantation. The p-FETs T2 and T4 are accommodated within the lower, n-doped region 44 of the silicon block 27, while the n-FETs T3 and T1 are disposed within the upper, p-doped region 46.

Figure 6:
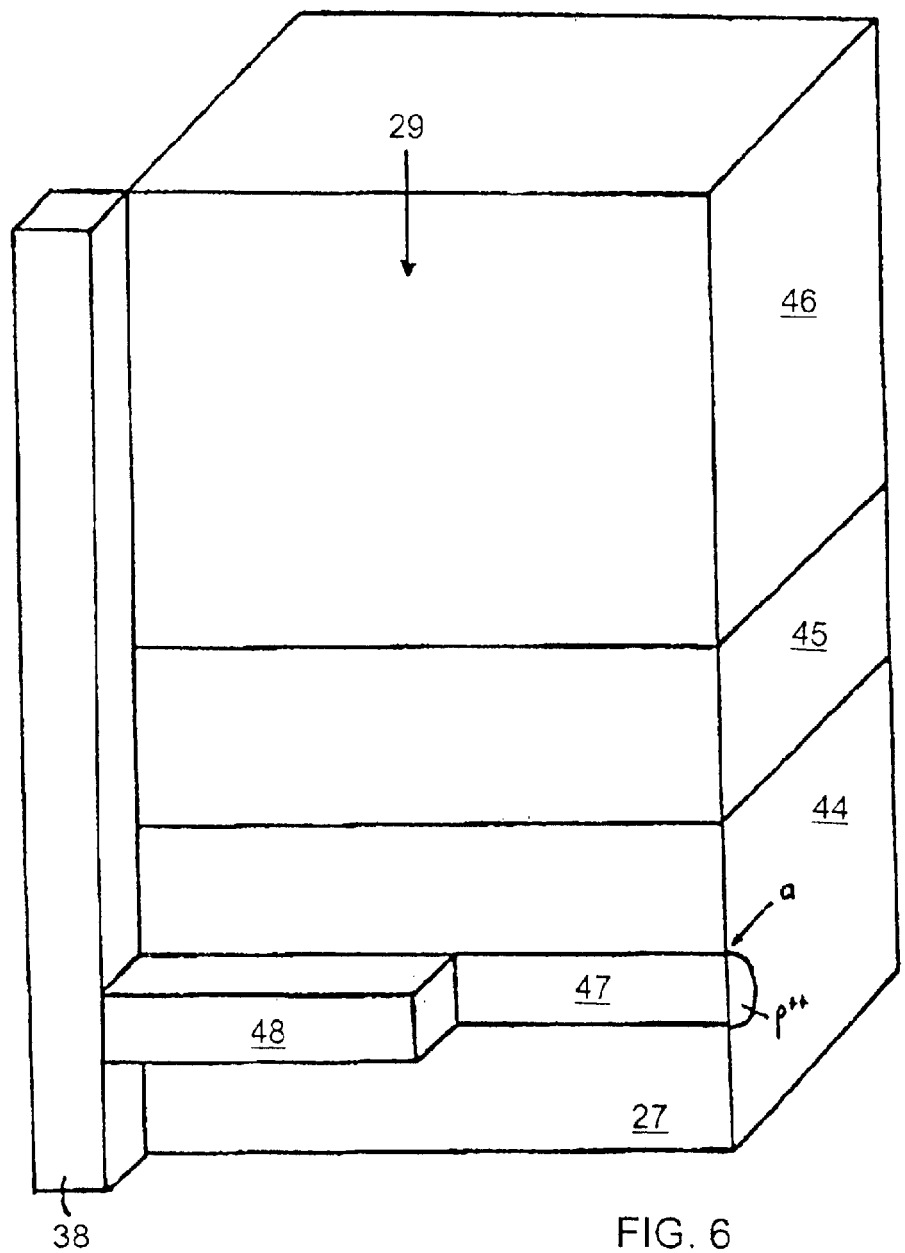
FIG. 6 is a perspective view of a first method state in the fabrication of the silicon structure shown in FIG. 5.

The drain electrode of the field-effect transistor T2 is fabricated first. Heavily p-doped material is deposited into the etching trench 29 and etched back as far as a depth a in a subsequent process step. In a subsequent heat treatment step, the entire silicon structure is subjected to a high level of heating, so that the doping material indiffuses into the silicon block 27 from the etching trench 29. A p-doped diffusion region 47 serving as drain electrode of the field-effect transistor T2 is produced in this way. After the p-doped material has indiffused into the silicon block 27, it is removed again from the etching trench 29. The etching trench 29 is filled with insulating material 48 as far as the first depth a. This method state is illustrated in FIG. 6.

As can be seen from the circuit diagram in FIG. 4B, the diffusion region 47 has to be connected to the potential $V_{cc}$. FIG. 5 reveals how the heavily p-doped diffusion region 47 is contact-connected from the etching trench 28 diagonally across by the voltage supply line 32. The voltage supply line 32 is at the potential $V_{cc}$.

Figure 7:
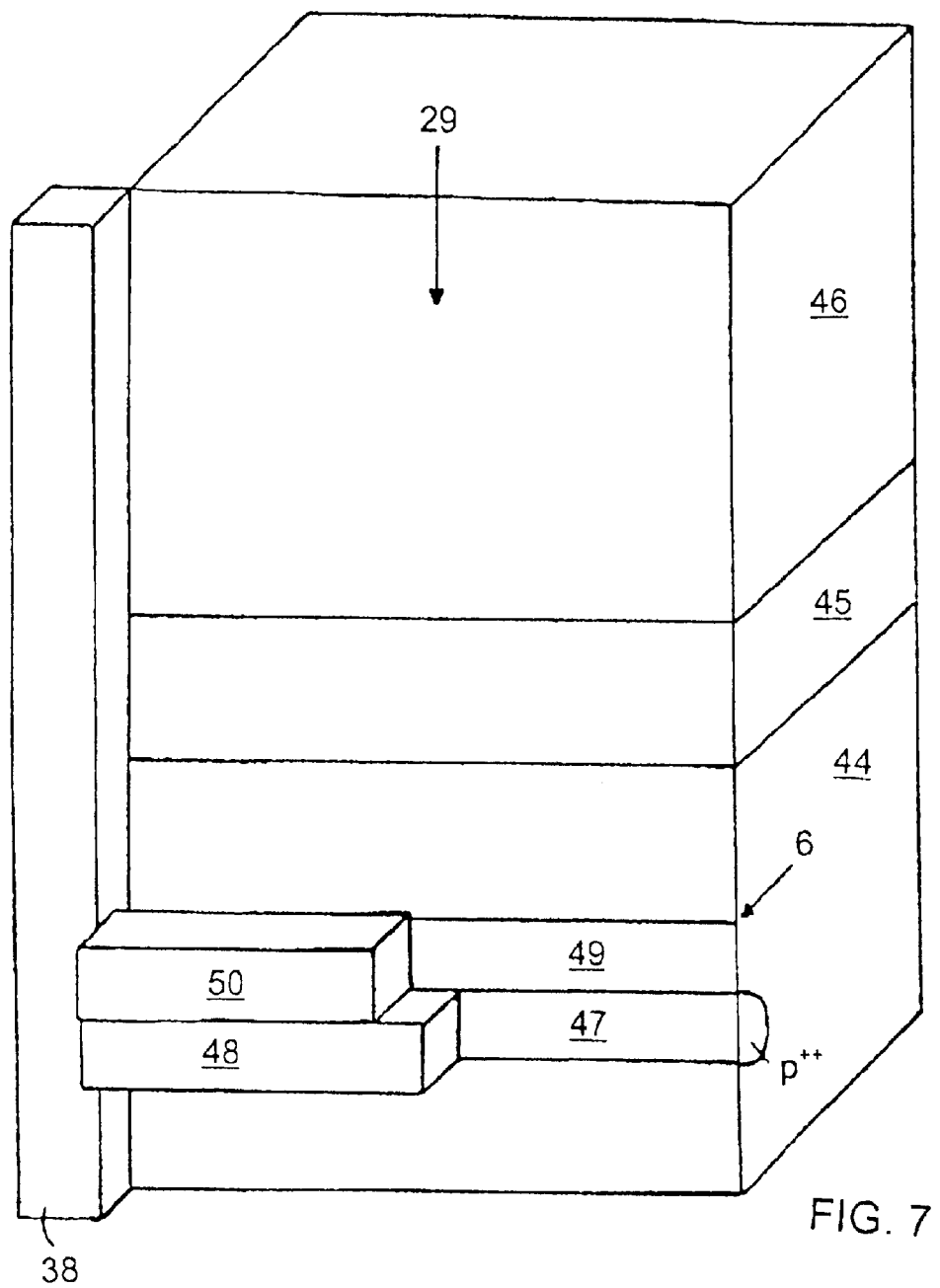
FIG. 7 is a perspective view of a second method state in the fabrication of the silicon structure shown in FIG. 5.

Next, the source electrode of the p-FET T2 is patterned. For this purpose, first a gate oxide layer 49 is grown on the silicon block 27 in the etching trench 29. This is usually done by thermal oxidation. In order to fabricate the gate electrode, a conductive material is subsequently deposited into the etching trench 29 and etched back as far as a depth b by a second recess process in order thus to obtain a conductive gate region 50. The depth b defines the extent of the gate region 50 and thus the channel length of the transistor T2. The gate oxide layer 49 is also etched back as far as the depth b, it being possible for the etching-back of the conductive gate region 50 and of the gate oxide layer 49 to be effected in one step or in two steps. The method state is illustrated in FIG. 7.

It can be seen from FIG. 5 that the gate region 50 of the transistor T2 is contact-connected by the interconnect 39 accommodated in the lateral etching trench 30.

Figure 8:
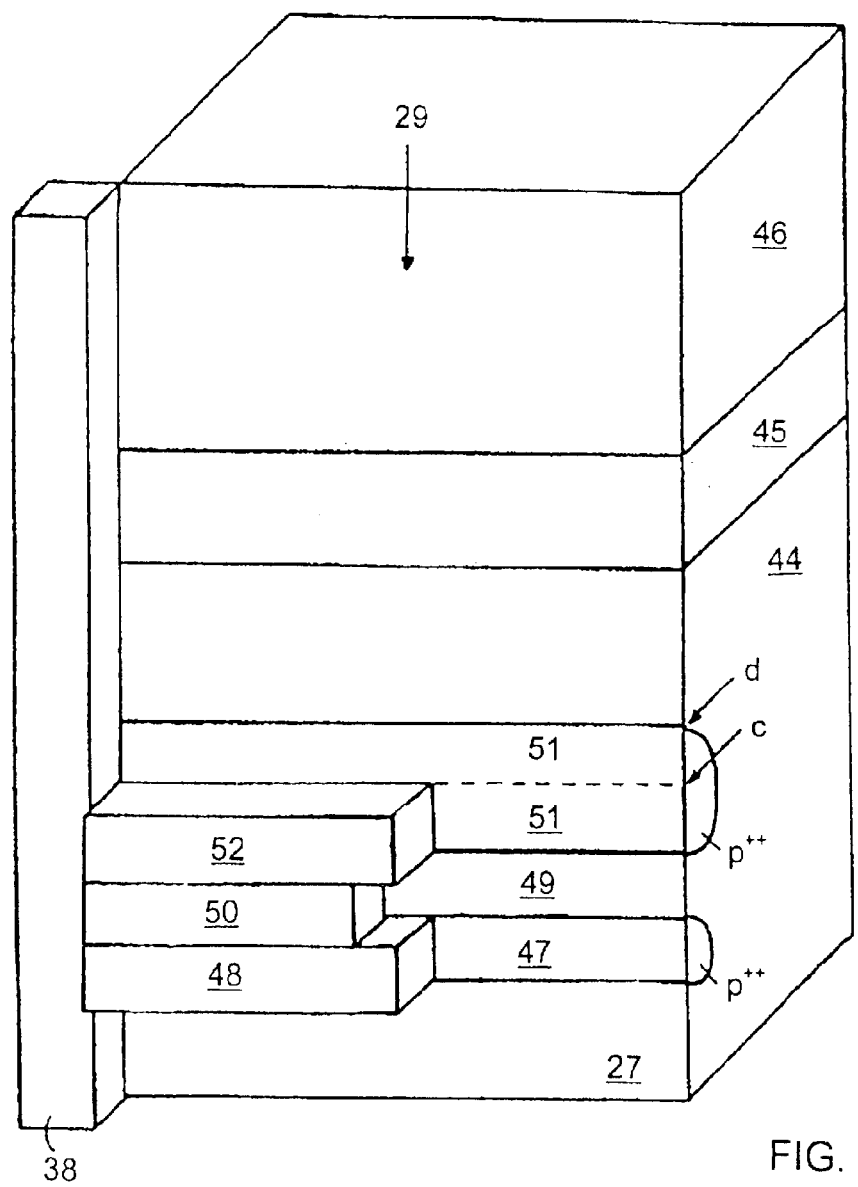
FIG. 8 is a perspective view of a third method state in the fabrication of the silicon structure shown in FIG. 5.

For the patterning of the source terminal of T2, heavily p-doped material is thereupon introduced into the etching trench 29 and etched back as far as the depth d in a further recess step. In a subsequent heat treatment step, the entire silicon structure is heated to such a high level that the doping atoms penetrate into the silicon block 27 from the p-doped layer situated in the etching trench 29. A p-doped diffusion region 51, which serves as a source electrode of the p-FET T2, is produced in this way. The highly doped material is removed from the etching trench 29, and an insulating material 52 is subsequently deposited into the etching trench 29. The insulating material 52 is etched back as far as a depth c in a subsequent recess process step. In this case, the depth c is chosen such that the insulating material 52 only partly covers the diffusion region 51. FIG. 8 shows the method state thus reached.

In order to produce the source contact connection, a conductive material is deposited into the etching trench 29 and subsequently etched back as far as the depth b in a further recess process step in order thus to obtain a conductive region 53. The heavily p-doped diffusion region, that is to say the source region 51 of the p-FET T2, can be contact-connected by the conductive region 53. This concludes the patterning of the source, the gate and the drain of the p-FET T2. Depending on the gate potential, a conductive channel can be formed between the source and the drain, which is to say between the two p-doped diffusion regions 51 and 47.

Figure 9:
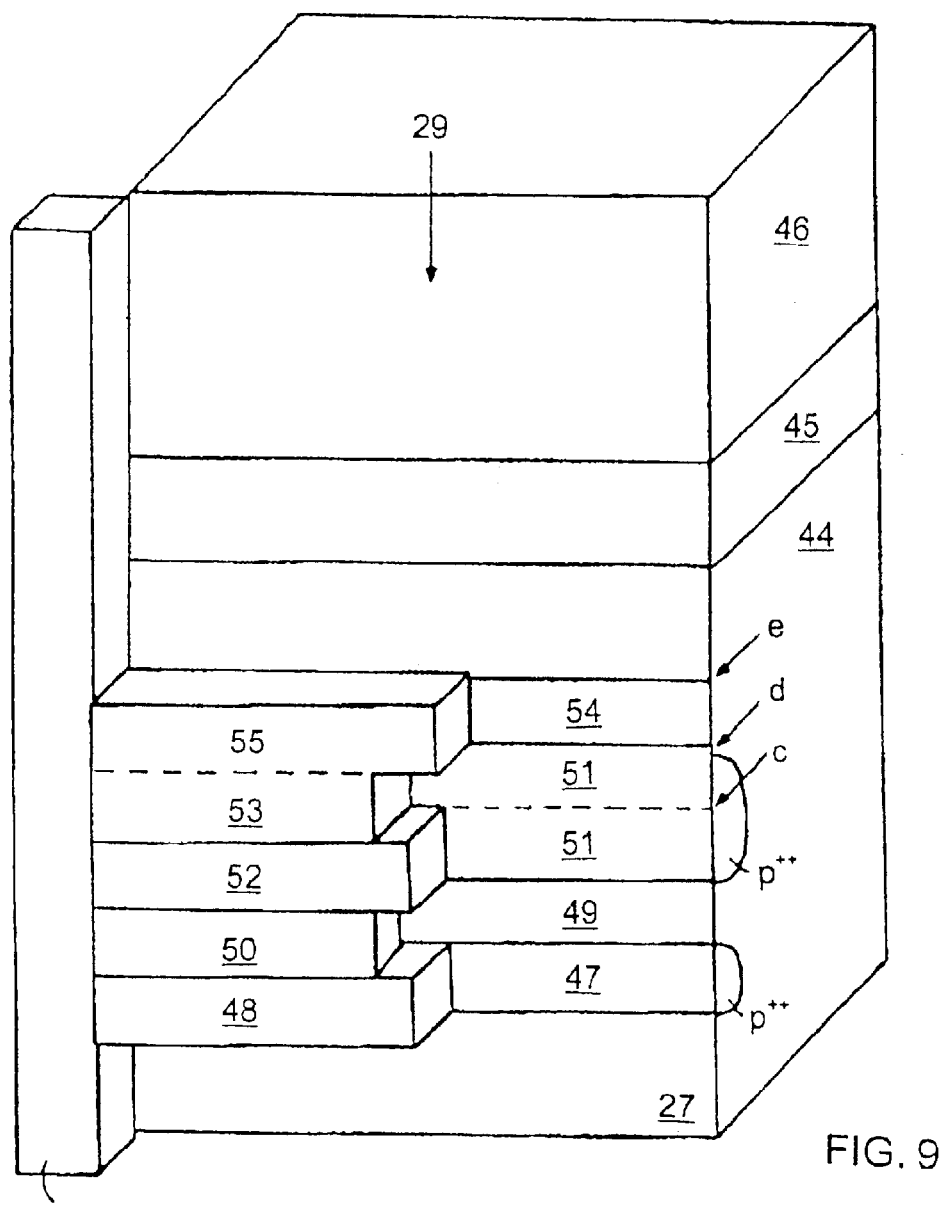
FIG. 9 is a perspective view of a fourth method state in the fabrication of the silicon structure shown in FIG. 5.

Next, a thick oxide 54 is grown on the silicon block 27. The thick oxide 54 is preferably produced in a thermal process. A conductive material is thereupon deposited into the etching trench 29. Afterward, both the conductive material and the thick oxide 54 are etched back as far as a depth e, and a conductive region 55 is obtained in this way. This method state is illustrated in FIG. 9.

Figure 10:
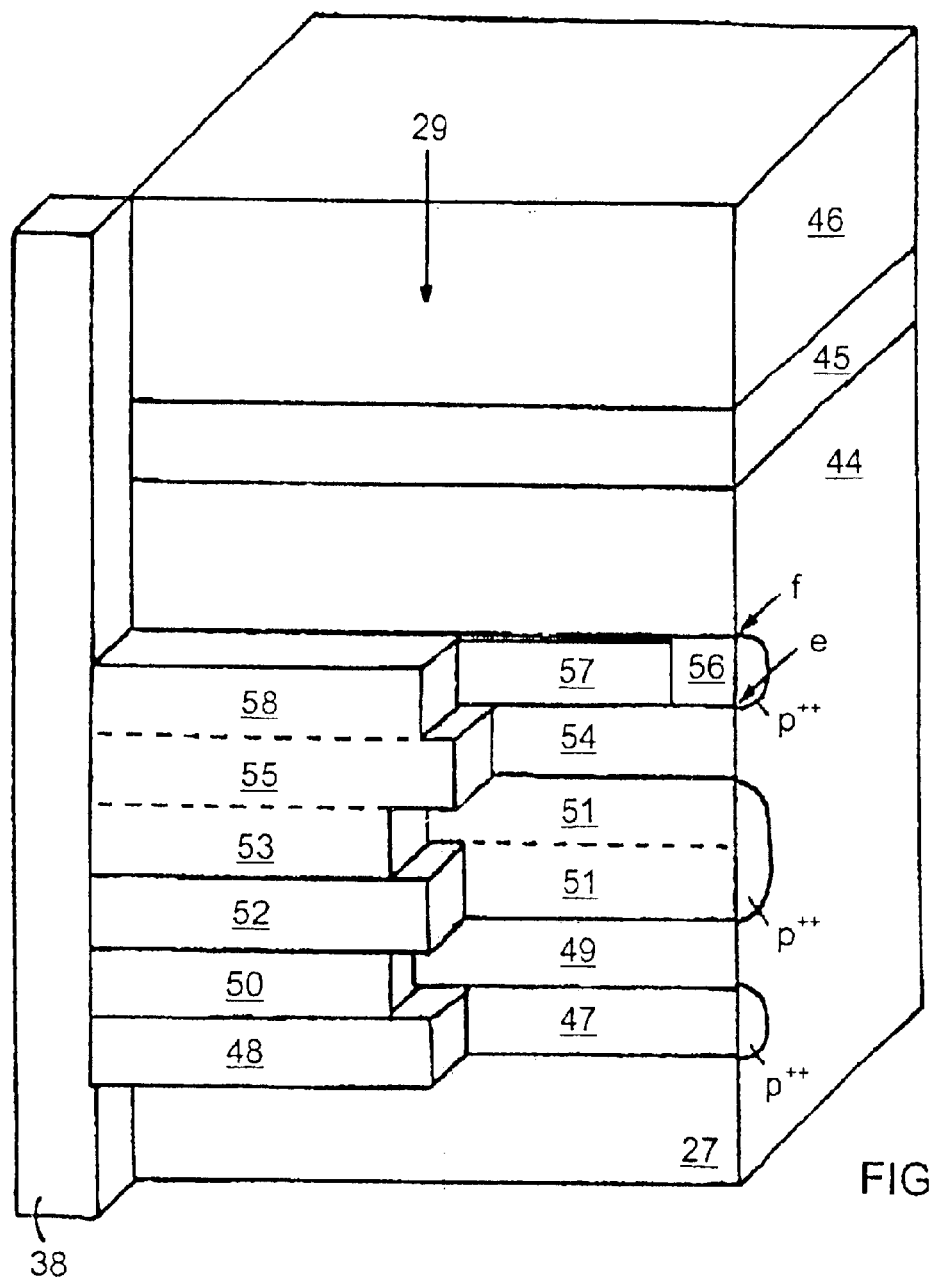
FIG. 10 is a perspective view of a fifth method state in the fabrication of the silicon structure shown in FIG. 5.

Next, the drain electrode of the transistor T4 is patterned. Since T4 is a p-type field-effect transistor, the transistor T4 is patterned into the n-doped region 44 of the silicon block 27 exactly like the transistor T2. In order to fabricate the drain electrode of T4, first a heavily p-doped material is deposited into the etching trench 29 and etched back as far as a depth f. In the subsequent heat treatment step, the p-doped material is diffused into the silicon block 27. A p-doped diffusion region 56 is obtained in this way. The heavily p-doped material can be removed from the etching trench 29 after the heat treatment step. Afterward, a thick oxide 57 is grown on the silicon block 27, and the etching trench 29 is filled with a conductive material. The thick oxide 57 has the task of insulating the diffusion region 56 from the conductive material. Both the conductive material and the thick oxide 57 are etched back as far as the depth f in a subsequent recess step, and a conductive region 58 is obtained in this way. FIG. 10 shows the method state thus obtained.

FIG. 4B reveals that the drain contact of T4 has to be connected to the potential $V_{cc}$. FIG. 5 reveals how the diffusion region 56 is contact-connected by the voltage supply line 33 from the lengthened etching trench 28. Moreover, FIG. 5 reveals, in the front etching trench 29, an interconnect 59 which connects together the source electrode of T2, the gate of T4, the gate of T3 and also the drain electrode of T1. The conductive regions 53, 55, 58 discernable in FIG. 10 are partial elements of the interconnect 59 depicted in FIG. 5.

Figure 11:
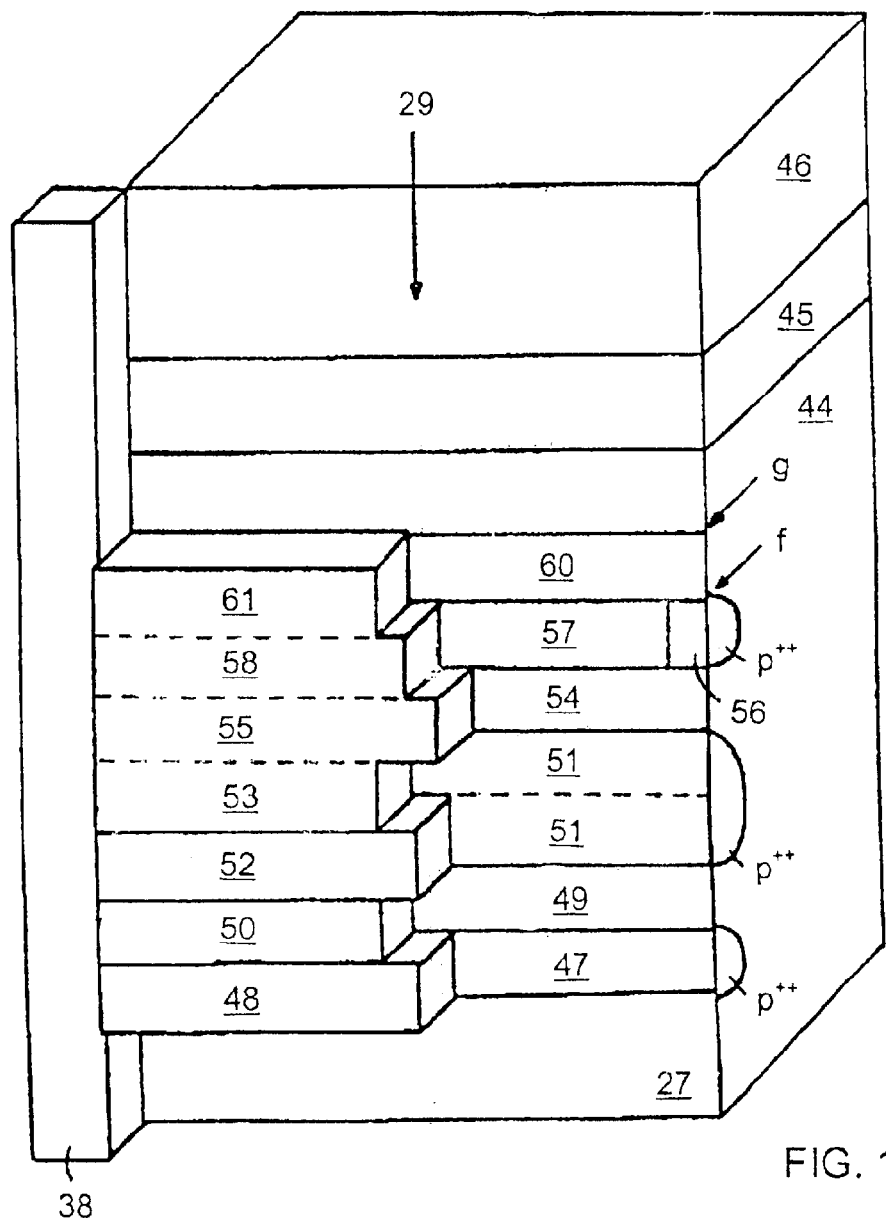
FIG. 11 is a perspective view of a sixth method state in the fabrication of the silicon structure shown in FIG. 5.

The gate of the transistor T4 is subsequently patterned. To that end, a gate oxide layer 60 is grown on the silicon block 27; in addition, a conductive material is deposited into the etching trench 29. In a subsequent recess process step, both the conductive material and the gate oxide layer 60 are etched back as far as a depth g in order thus to pattern a conductive gate region 61. This defines a channel length of the field-effect transistor T4. FIG. 11 shows the method state thus obtained.

Figure 12:
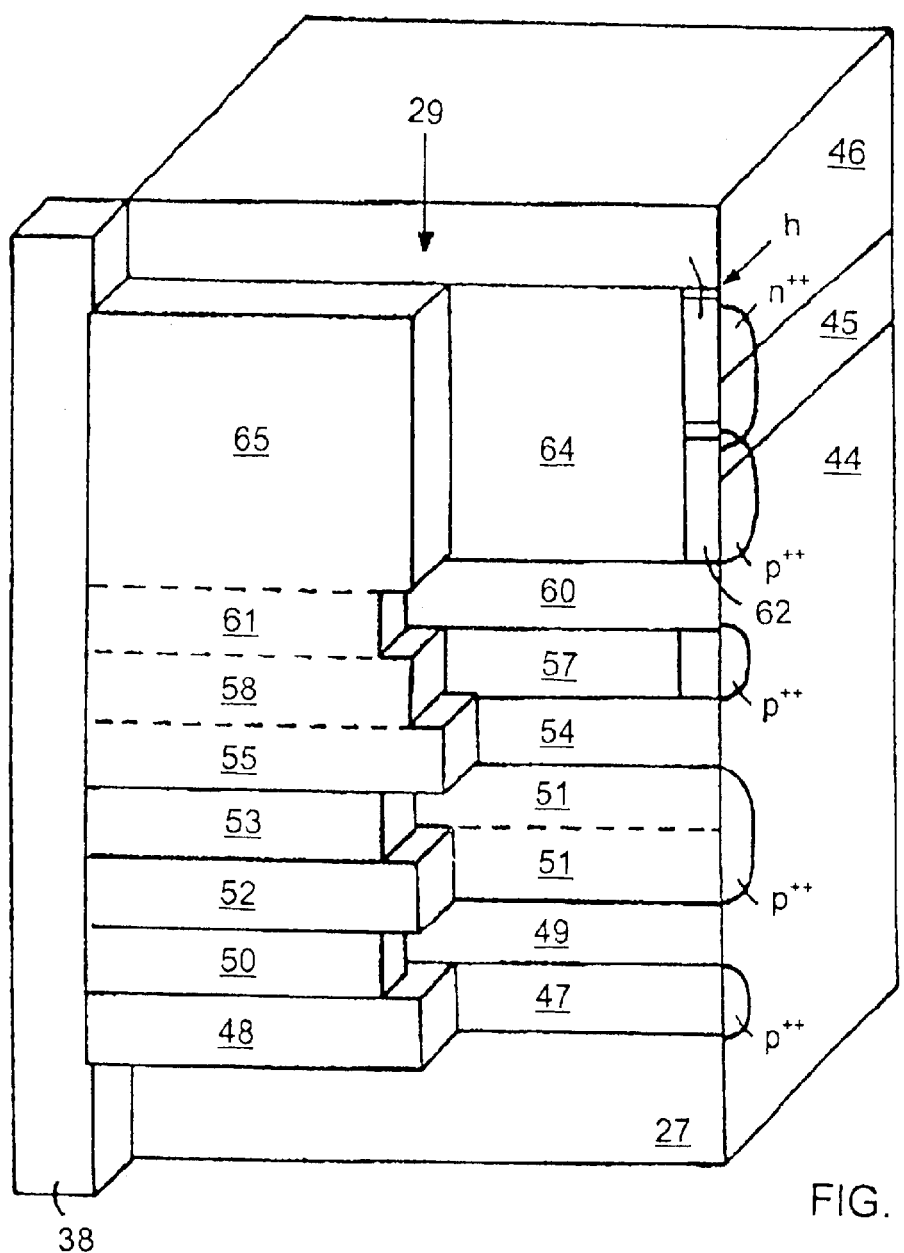
FIG. 12 is a perspective view of a seventh method state in the fabrication of the silicon structure shown in FIG. 5.

A heavily p-doped diffusion region is required for producing the source electrode of the p-FET T4, which diffusion region has to be disposed in the n-doped region 44 of the silicon block 27. By contrast, a heavily n-doped diffusion region is required for the drain electrode of the n-FET T3, which diffusion region, however, must already be disposed in the p-doped region 46 of the silicon block 27. In order to produce the two diffusion regions, first a heavily p-doped material is deposited into the etching trench 29 and etched back as far as the depth of the intrinsic transition region 45. Afterward, a heavily n-doped material is deposited into the etching trench 29 and etched back as far as a depth h. Heat treatment of the silicon structure yields a p-doped diffusion region 62 (source of T4) and also an n-doped diffusion region 63 (drain of T3). Both the heavily n-doped and the heavily p-doped material are removed from the etching trench 29 after the heat treatment. A thick oxide 64 is grown on the silicon block 27 by thermal oxidation; in addition, a conductive material is deposited. The conductive material and the thick oxide 64 are then etched back as far as the depth h, and a conductive region 65 is obtained in this way. This method state is shown in FIG. 12.

It can be seen from FIG. 4B that the source electrode of the p-FET T4 and the drain electrode of the n-FET T3 have to be connected to one another. It is evident from FIG. 5 that this connection is produced by the interconnect 40 which contact-connects both the diffusion region 62 and the diffusion region 63. By the conductive plate 43 associated with the back layer structure, the interconnect 40 is connected to the interconnect 39 and thus to the gate of T2. By the conductive plate 43, the interconnect 40 is also connected to the interconnect 41 and thus to the gate of T1. Furthermore, a connection to the source-drain path of the selection transistor T0 is produced by the conductive plate 43 and the interconnect 42. All the horizontal connections are accommodated in the lateral etching trench 30.

Figure 13:
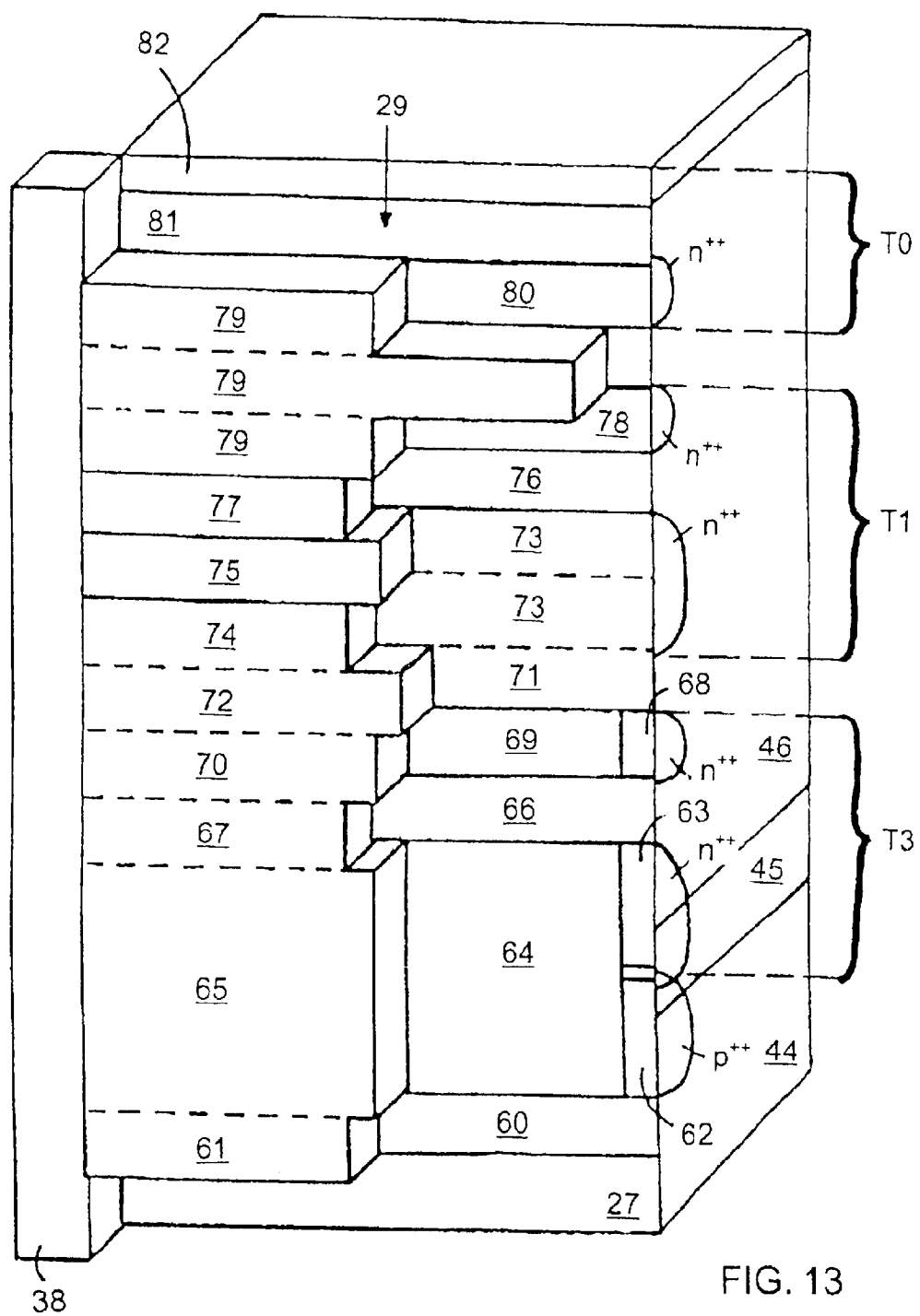
FIG. 13 is a perspective view of an eighth method state in the fabrication of the silicon structure shown in FIG. 5.

The n-FETs T3 and T1 are fabricated analogously to the fabrication of T2 and T4 already described. In contrast to the p-FETs T2 and T4, the n-FETs T3 and T1 have to be disposed within the upper, p-doped region 46 of the silicon block 27. FIG. 13 shows the various layers associated with the transistors T3 and T1 and with the selection transistor T0. The way in which the drain electrode of T3, that is to say the diffusion region 63, is fabricated has already been discussed in connection with FIG. 12. Disposed above the drain electrode is the gate of T3, which contains a gate oxide layer 66 and also a conductive gate region 67. The source electrode of T3 contains a heavily n-doped diffusion region 68, which is insulated from a conductive region 70 by a thick oxide 69. In the same way as the gate region 61 and the conductive region 65, the gate region 67 and the conductive region 70 are also partial elements of the interconnect 59 shown in FIG. 5.

The source electrode of T3, that is to say the n-doped diffusion region 68, has to be connected to the potential GND. It can be seen from FIG. 5 that the diffusion region 68 is contact-connected by the voltage supply line 34 from the etching trench 28.

A thick oxide 71 is situated in the region between the two transistors T3 and T1, said thick oxide insulating a conductive region 72 from the silicon block 27. The drain electrode of the transistor T1, which is formed as a heavily n-doped diffusion region 73, is contact-connected by the conductive region 72 and a conductive region 74. An insulation layer 75 is disposed above the conductive region 74. A gate oxide layer 76 and also a conductive gate region 77 form the gate of the transistor T1. As can be seen from FIG. 5, the conductive gate region 77 is connected to the rear conductive plate 43 by the interconnect 41. The source electrode of T1 disposed there-above, a heavily n-doped diffusion region 78, is connected diagonally across to the voltage supply line 35 shown in FIG. 5, which is at the potential GND. Insulation material 79 is disposed above the source electrode of T1. An insulation material that has a certain resistance with respect to further etching processes carried out later is preferably used in this case.

The selection transistor T0, which is likewise an n-type transistor, is disposed at an upper end of the silicon block 27. A heavily n-doped diffusion region 80 serves as first source or drain electrode of T0. The topmost layer of the silicon block 27 is formed as a heavily n-doped implantation region 82 and serves as second source or drain electrode of the transistor T0. The heavily n-doped implantation region 82 is produced from the surface of the silicon block 27 by ion implantation (for example using arsenic). This region serves, on the one hand, as the second source/drain terminal of the transistor T0 and, on the other hand, for the contact connection of the bit line 37 running directly at the surface of the silicon block 27, which is depicted in FIG. 5.

It can also be seen from FIG. 5 that the word line 36 accommodated in the etching trench 28 is disposed at the level of an intermediate region 81 between the diffusion region 80 and the implantation region 82. The word line 36 represents the gate of the selection transistor T0. If a positive potential is present on the word line 36, then a conductive channel forms approximately at the level of the intermediate region 81, and the source-drain path of the selection transistor T0 becomes conducting. The flip-flop containing the transistors T1, T3, T4 and T2 is then connected to the bit line 37 by the source-drain path of T0 and can be read from or written to by the bit line 37.

I claim:

1. A circuit structure, comprising:

a silicon substrate having at least two etching trenches formed therein and defining a silicon block having sidewalls, said etching trenches etched out in a manner adjoining said sidewalls of said silicon block, said etching trenches disposed at angles with respect to one another prescribed by a form of said silicon block, said etching trenches including a first etching trench and a second etching trench disposed adjacent said first etching trench;

first and second doped diffusion regions extending from said first and second etching trenches into said silicon block and having an overlap region; and layer structures disposed in said etching trenches, said layer structures including conductive structures disposed in said etching trenches, said conductive structures within said first etching trench and said conductive structures within said second etching trench being electrically connected to one another by said first and second diffusion regions extending from said first and second etching trenches into said silicon block.

2. The circuit structure according to claim 1, further comprising field-effect transistors formed within said etching trenches and said silicon block, each of said field-effect transistors having a first diffusion region functioning as a first source/drain region and extending into said silicon block, a conductive gate region, and a second diffusion region functioning as a second source/drain region and extending into said silicon block, a conductive channel being formed between said first and second source/drain regions in dependence on a potential of said conductive gate region.

3. The circuit structure according to claim 1, further comprising regions have at least one of different doping concentrations and different conductivity types are disposed within said silicon block.

4. The circuit structure according to claim 1, further comprising voltage supply lines and signal lines for said layer structures are in each case accommodated in one of said etching trenches.

5. The circuit structure according to claim 4, wherein:
said voltage supply lines and said signal lines are in each case accommodated in said first etching trench;
said layer structures are accommodated in said second etching trench; and
said layer structures have interconnections accommodated in said second etching trench.

6. The circuit structure according to claim 1, wherein said silicon block is a silicon parallelepiped.

7. The circuit structure according to claim 6, wherein said etching trenches are four etching trenches disposed around said silicon parallelepiped.

8. The circuit structure according to claim 1, wherein the circuit structure is an SRAM memory cell.

9. The circuit structure according to claim 8, wherein the SRAM memory cell contains a plurality of field-effect transistors interconnected to form a flip-flop and a selection transistor.

10. The circuit structure according to claim 9, wherein:
said silicon block has a p-doped region and an n-doped region; and
said field-effect transistors interconnected to form said flip-flop contain both n-FETs and p-FETs, said n-FETs being disposed in a region of said p-doped region of said silicon block, and said p-FETs being disposed in a region of said n-doped region of said silicon block.

11. The circuit structure according to claim 9,
wherein said selection transistor has a source-drain path; and
further comprising a bit line disposed at a surface of said silicon substrate, said flip-flop connected to said bit line through said source-drain path of said selection transistor.

12. The circuit structure according to claim 9, further comprising a word line disposed in said etching trenches, said selection transistor being activated by said word line.

13. The circuit structure according to claim 12,
wherein said word line serves as a gate region of said selection transistor; and
further comprising a gate oxide layer disposed between said word line and said silicon block.

14. The circuit structure according to claim 11, wherein said silicon block has an upper region being a doped region and said bit line disposed at said surface of said silicon substrate being contact-connected to said upper region.

15. The circuit structure according to claim 14, wherein said upper region formed as said doped region serves as one of a source electrode and a drain electrode of said selection transistor.

16. The circuit structure according to claim 1, wherein said conductive structures disposed are formed from polysilicon.

17. The circuit structure according to claim 1, wherein said layer structures are semiconductor layer structures.

18. An array configuration, comprising:
a multiplicity of circuit structures, including:
a silicon substrate having at least two etching trenches formed therein and defining silicon blocks having sidewalls, said etching trenches etched out in a manner adjoining said sidewalls of said silicon blocks, said etching trenches disposed at angles with respect to one another prescribed by a form of said silicon blocks, said etching trenches including a first etching trench and a second etching trench disposed adjacent said first etching trench;
first and second doped diffusion regions extending from said first and second etching trenches into said silicon block and having an overlap region; and
layer structures disposed in said etching trenches, said layer structures including conductive structures disposed in said etching trenches, said conductive structures within said first etching trench and said conductive structures within said second etching trench being electrically connected to one another by said first and second diffusion regions extending from said first and second etching trenches into said silicon block.

19. The array configuration according to claim 18,
wherein said etching trenches disposed in each case in a manner adjoining a specific sidewall of said silicon blocks are lengthened to form continuous etching trenches extending across a plurality of said silicon blocks; and
further comprising voltage supply lines and signal lines accommodated in said continuous etching trenches.

20. An array configuration, comprising:
a silicon substrate having at least two etching trenches formed therein and defining silicon blocks having sidewalls, said etching trenches etched out in a manner adjoining said sidewalls of said silicon blocks, said etching trenches disposed at angles with respect to one another prescribed by a form of said silicon blocks, said etching trenches including a first etching trench and a second etching trench disposed adjacent said first etching trench;
first and second doped diffusion regions extending from said first and second etching trenches into said silicon block and having an overlap region; and
layer structures disposed in said etching trenches and forming a multiplicity of SRAM memory cells, said layer structures including conductive structures disposed in said etching trenches, said conductive structures within said first etching trench and said conductive structures within said second etching trench being electrically connected to one another by said first and second diffusion regions extending from said first and second etching trenches into said silicon block.

21. The array configuration according to claim 20, wherein said etching trenches disposed in each case in a manner adjoining a specific sidewall of said silicon blocks are lengthened to form continuous etching trenches extending across a plurality of said silicon blocks; and further comprising voltage supply lines and signal lines accommodated in said continuous etching trenches.

22. A circuit structure, comprising:

a silicon substrate having at least two etching trenches formed therein and defining a silicon block having sidewalls, said etching trenches etched out in a manner adjoining said sidewalls of said silicon block, said etching trenches disposed at angles with respect to one another prescribed by a form of said silicon block; and layer structures disposed in said etching trenches, said layer structures forming an SRAM memory cell.

23. The circuit structure according to claim 22, wherein the SRAM memory cell contains a plurality of field-effect transistors interconnected to form a flip-flop and a selection transistor.

* * * * *